United States Patent [19]

Sahakian

[11] Patent Number: 4,907,065
[45] Date of Patent: Mar. 6, 1990

[54] INTEGRATED CIRCUIT CHIP SEALING ASSEMBLY

[75] Inventor: Vahak K. Sahakian, Los Altos Hills, Calif.

[73] Assignee: LSI Logic Corporation, Milpitas, Calif.

[21] Appl. No.: 162,716

[22] Filed: Mar. 1, 1988

[51] Int. Cl.$^4$ ................... H01L 23/30; H01L 23/48
[52] U.S. Cl. .......................................... 357/68; 357/74
[58] Field of Search ..................... 357/68, 74, 72, 81

[56] References Cited

U.S. PATENT DOCUMENTS

| 4,355,463 | 10/1982 | Burns | 437/217 |
| 4,398,208 | 8/1983 | Murano et al. | 357/72 |
| 4,672,418 | 6/1987 | Moran et al. | 357/74 |
| 4,731,699 | 3/1988 | Nitta et al. | 357/81 |

FOREIGN PATENT DOCUMENTS

| 128846 | 10/1980 | Japan. | |
| 0166753 | 10/1983 | Japan | 357/74 |
| 0084842 | 5/1985 | Japan | 357/74 |
| 0104056 | 5/1987 | Japan | 357/74 |
| 3304215 | 7/1984 | Netherlands | 357/74 |
| 0240628 | 11/1986 | Netherlands | 357/74 |

OTHER PUBLICATIONS

IBM Disclosure, "Ceramic Leaded Chip Carrier Capping Techniques", vol. 29, No. 2, Jul. 1986, pp. 916–918.

Primary Examiner—Andrew J. James
Assistant Examiner—Viet Q. Nguyen
Attorney, Agent, or Firm—Skjerven, Morrill, MacPherson, Franklin & Friel

[57] ABSTRACT

An integrated circuit (IC) chip package is formed by extending the overall dimensions of a standard IC on a semiconductor substrate, typically a first silicon wafer, to provide an integral band of semiconductor material therearound on which are formed a series of spaced IC chip input/output pad areas extending along the band. A bottom peripheral edge of a discrete cap of the same semiconductor material, e.g. silicon, is sealingly affixed around an inner periphery of the band inboard of the series of pad areas and outboard of the IC active circuit areas, so that the cap interior spacedly covers the active circuit area and the input/output pad areas are exposed. The caps may be made by photolithography and microetching techniques from a second semiconductor wafer of the same type as the IC wafer. Metallization extends on the first wafer from connect pads on the active circuit area to the extended and exposed input/output pad areas exterior of the cap. The IC may be probed for test purposes prior to capping. Use of lead frames, plastic encapsulation processes and a ceramic housing are avoided, while maximizing the use of compatible materials having the same coefficient of thermal expansion. In one embodiment, essentially an "all silicon" package is provided.

9 Claims, 2 Drawing Sheets

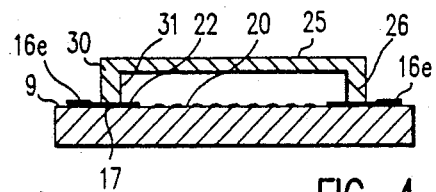
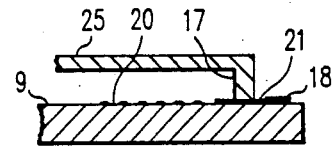
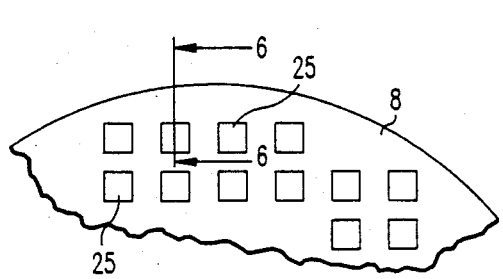
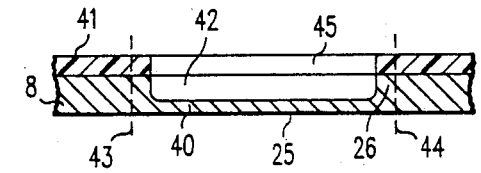
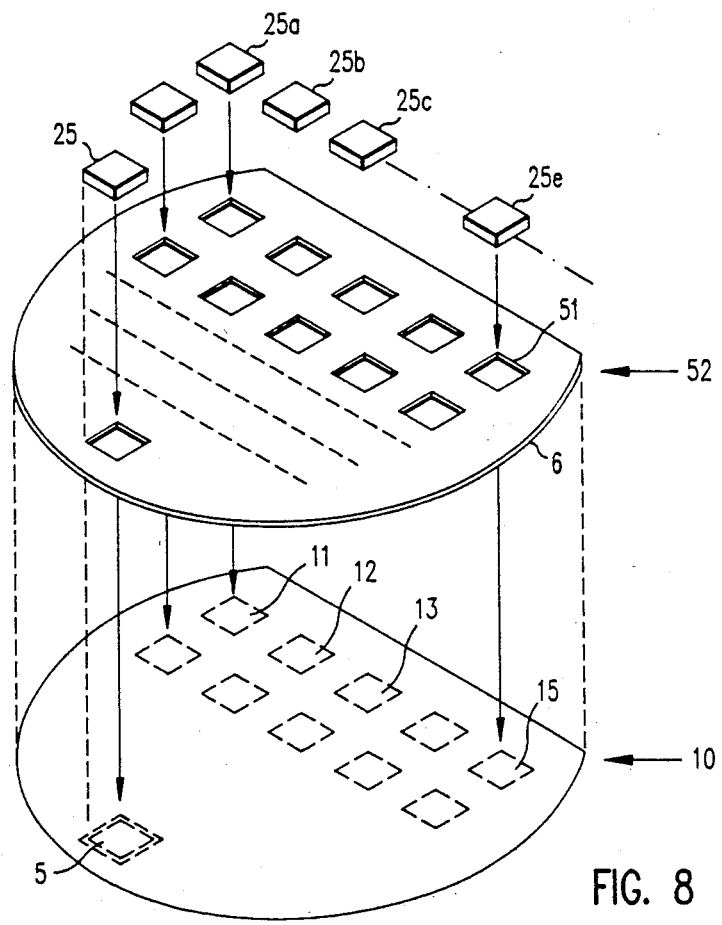

INTEGRATED CIRCUIT CHIP SEALING ASSEMBLY

BACKGROUND OF THE INVENTION

1. Field of the Invention

This invention relates to integrated circuit assemblies, more particularly to a low-cost, slim, hermetically sealed integrated circuit package and method of manufacture without the normal lead frame, and avoiding plastic encapsulation or use of a ceramic housing.

2. Material Art

Various package schemes have been proposed and used in the integrated circuit (IC) chip art. These provide physical protection for the IC and external electrical connections to the integrated circuits of the chip. Very prevalent are designs including lead frames with extending lead fingers, with an IC mounted on a central part of the frame Interconnections, such as wire bonds, are made between pads on the IC and the fingers. The overall device, other than exteriorly extending leads, is then encapsulated with an epoxy or other plastic to form what is known, for example, as a DIP — dual-in-line package or PLCC — Plastic Leaded Chip Carrier. Other designs utilize a ceramic housing in which an IC is mounted and interconnect metallization provided on surfaces of the housing extending to an exterior position. Bonding wires are connected between IC pads and the metallization and a ceramic or metal lid is attached to the housing to complete the assembly. Ceramic packages are normally higher in cost than plastic packages and oft times must be custom-designed. Plastic packages with lead frames are susceptible to poor hermetic sealing due to penetration of moisture through the package to the chip by moisture traveling along plastic voids or by capillary action, resulting in degradation and reduced reliability. While plastic packages have been designed for insertion on printed circuit boards and the like using automatic insertion equipment, ceramic assemblies are generally more difficult to insert, though they are better than plastic assemblies in being hermetically sealed. Thermal expansion problems are present with respect to both plastic and ceramic chip carriers due to differences in the materials of the carrier and the semiconductor material used in the chip per se.

Other concerns of IC chip package designers and engineers are the costs of materials and manufacture including tooling and assembly, minimization of size, particularly the height of the assembly, short-runs and quick turn-around capability, density of IC input/output pins, low temperature processing and testability of the completed package.

SUMMARY OF THE INVENTION

This invention provides an "all silicon" or other semiconductor chip package and method in which an active chip area is covered by a silicon or matching semiconductor cap sealingly affixed to an extended silicon band area integral to and extending around the active chip area. Chip connect pads, representing sites of the input/output pins of the IC, extend to an outboard periphery of that band area exteriorly of the silicon cap seal, with interconnect metallization extending from the outboard pads to the contact sites of circuit elements in the IC chip underneath the silicon cap. The result is an "all silicon" package of low cost, avoiding the use of ceramics. While the invention has been described as "all silicon", it is contemplated that the wafer including the active chip area may be gallium arsenide, germanium, or other semiconductor material and the cap may be from the same material. The improved package seals the IC active areas hermetically, is a package of minimal size, particularly in its thickness, has high "pin" density, and due to use of an all silicon construction avoids the use of package materials of different rates of thermal expansion. The invention finds particular utility in so-called ASICs (Application Specific IC), where packages must be provided for small lots in quick turn-around situations utilizing CAD and CAM techniques.

The essence of the invention involves extending the normal chip geometry by about 12 mils on each side of a rectangular active chip area to form a peripheral band and locating the chip input/output bonding pads in that extended peripheral band outside a silicon capped chip. Metallization connects the exposed chip bonding pads to appropriate connect pads of the integrated circuit in the active chip area prior to passivation.

The method of the invention is normally carried out while a matrix of ICs is still in wafer form, i.e. lined up in rows and ranks over the wafer surface. Silicon caps, made by conventional photolithographic masking and etching processes from the same type of silicon wafer on which the matrix of ICs are formed, are sealingly mounted on each of the chips outboard of the chip active area and inboard of the chip connect pad areas. The individual IC may be tested either before or after cap affixation while they are still part of the overall semiconductor wafer from which they have been made. The overall wafer, with the chip active areas of each IC protected by a silicon cap, is then sawn into individual IC chips and the "good" packages sorted. A method results so that the above "package fab" is similar to present methods of sawing the wafer at a pre-packaging "die fab" stage.

External leads may be attached to the chip connect pads; the exposed chip connect pads may be essentially flat for wire bonding in a multichip or single chip fashion or may be in bump form lending themselves to use in so-called TAB (tape automated bonding) chip connection fabrication. Silicon fixtures may be used for positioning of the silicon caps over the IC active areas, or positioning the resultant "all silicon" package onto silicon substrates and other silicon surfaces. The fixtures preferably are made of silicon employing low cost photolithography tools. Using silicon fixtures avoids all thermal mismatch problems due to unequal expansion of the fixtures and the caps or finished packages being handled by the fixtures.

The package is formed before the final leads are attached to the chip pads so that packaging of the active chip portion does not possibly injure a wire bond or other connection susceptible to breakage.

BRIEF DESCRIPTION OF THE DRAWING

FIG. 4 is a side elevation view of the packaged chip taken on line 4—4 of FIG. 2.

FIG. 5 is a partial side elevation schematic view of a second embodiment of a packaged chip.

FIG. 6 is a schematic plan view of a partial matrix of package caps on a segment of a semiconductor wafer.

FIG. 7 is a side elevation view of a single cap taken on line 6—6 of FIG. 5 prior to the cap being sawn from a wafer.

FIG. 8 is an exploded view of the assembly of caps on the wafer utilizing an apertured positioning fixture.

DETAILED DESCRIPTION

Figure 1:
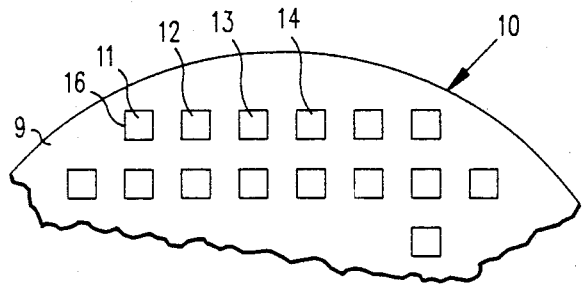
FIG. 1 is a schematic plan view of a partial matrix of integrated circuit chips on a segment of a semiconductor wafer.

FIG. 1 shows a segment of a semiconductor wafer 10, such as a silicon wafer normally of a nominal diameter of about 125, 150 or 175 millimeters and a thickness of from about 0.35 to 0.65 mm. In accord with standard semiconductor and integrated circuit fabrication processes, integrated circuit (IC) chips 11, 12, 13 and 14 are formed in a matrix of ranks and rows across the surface 9 of wafer 10. It is to be understood that each of the other chips on the wafer will have input/output chip connect pads 16 extending about their peripheries. The number of pads will be dependent on the number of pin positions needed for operation of the integrated circuit.

Figure 2:
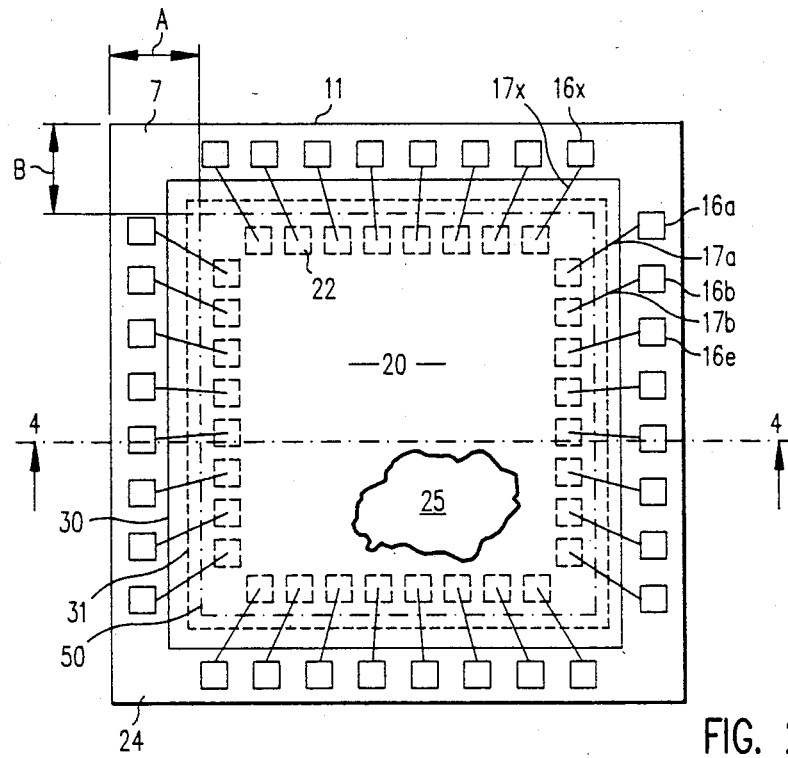
FIG. 2 is a schematic broken away plan view of an individual packaged chip of the invention.

Illustrated in FIG. 2 is a 32-pin or connect pad embodiment in which thirty-two pad areas 16a, 16b, ... 16e through 16x are provided, eight pads on each side of a rectangular, preferably a square, chip die. In prior art IC devices, the input/output connect pads are normally within the confines of the dash-dotted square 50 with suitable bond wires connecting the IC connect pads to fingers of a conductive lead frame or the like. Square 30 and dash line square 31 represent the outer and inner periphery, respectively, of the wall of a silicon cap 25 as described below. In the present invention, the normal chip die geometry represented by square 50 is extended outwardly by approximately twelve mils on all four sides in order to "carry" the input/output bonding pads 16 to a band area 7 outside the capped and packaged chip. This is shown by distances A and B. Metallization strips 17a, 17b through 17x, such as 12000 Angstroms thick, 20 μm wide deposits of aluminum on the wafer extend from the normal IC contact sites 22 to the new pad positions 16 on the outer band area 7 of the chip.

A semiconductor cap such as silicon cap 25 is positioned over the central active chip area 20 between that chip area and the extended spaced pads 16 so that the ends of a peripheral edge portion or wall 26 forming the cap is sealingly affixed between the locus of the thirty-two outer pads 16 and the central active chip area 20, i.e. over the metallization 17 connecting each of the pads 16 to connect sites 22 on the IC active chip area. An insulative sealant 21 (FIG. 3) such as screened glass paste is coated over all the exposed end of cap wall 26 or on the entire closed-loop seal band 5.

Figure 3:
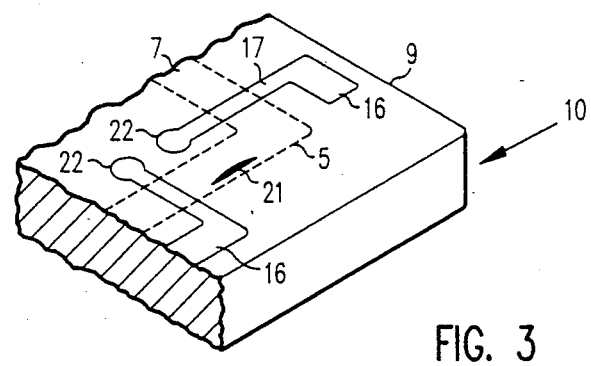
FIG. 3 is a partial perspective magnified view of a corner of the package prior to cap affixation.

FIG. 3 shows one corner of the package with continuous seal band 5 (outlined by dash lines) extending across metallization strips 17, which strips connect IC contact sites 22 to the new pad portions 16 exteriorly of the seal band 5.

As shown in FIG. 4, each of pads 16 may be formed as a bump 16e by providing an extra thickness of metallization or by addition of gold or other conductive material to facilitate use of the chip in TAB processing. The height of the typical cap 25 including wall 26 is typically 0.50 mm which normally will represent the thickness of the semiconductor wafer from which the cap is formed. A cap clearance from the inside surface of the cap of about 0.120 mm is provided over the active chip area 20.

FIG. 5 illustrates an embodiment wherein a normal aluminum metallized flat pad 18 is provided at each of the extended pad positions in the band area 7. Bond wires are normally attached to each of these flat pads 18 after the overall package chip shown in FIG. 2 has been affixed to a circuit board or other substrate so that pads 18 are connected to other leads (not shown).

FIG. 6 shows a semiconductor wafer 8 which provides sites for a matrix of silicon or other semiconductor caps 25. The caps are fabricated by masking and etching the wafer surface in accord with standard semiconductor fabrication techniques. As seen in FIG. 7, a maskant 41 may be formed utilizing photolithographic techniques around each desired site of a cap so that an unmasked area 45 permits etching into the surface of the wafer 8 to form a recess 42 representing the cap interior. After the wafer is sawn, represented by cuts 43, 44 and cuts perpendicular thereto (not shown), to form cap 25, a cap top 40 and surrounding wall 26 is formed. It is contemplated that cap 25 may be configured as a circle, square, oblong or otherwise to accommodate the desired form of IC. After or before the cap 25 is sealed over and around the active chip area 20 including the chip connect sites 22, each of the resultant chip packages can be tested while they remain as a wafer. Testing may also be done after the wafer 9 has been sawn to form the discrete IC packages. The IC packages may have external leads attached after the packages have been sawn from the wafer. Alternately the IC package(s) may be TAB or wire bonded in a multichip or single chip fashion onto a suitable substrate.

It is further contemplated that the ICs may be probed for test purposes prior to capping and only those "good" ICs meeting specifications may then be capped by a cap 25.

As seen in FIG. 8 a silicon fixture 52, in the form of a silicon wafer 6 of preferably the same dimensions as wafer 10, includes etched apertures 51 which serve to spatially locate each of the series of silicon caps 25a, 25b, 25c and 25e over corresponding IC's 11, 12, 13 and 15, respectively, when fixture 52 is positioned in registration with wafer 10. Each silicon cap is placed in an aperture 51 and the bottom edge of each cap registers with the seal band 5 surrounding each IC and is adhered thereto. The wafer fixture 52 is then lifted off or separated from wafer 10 and wafer 10 is in condition to be sawn into discrete IC's.

The above description of embodiments of this invention is intend to be illustrative and not limiting. Other embodiments of this invention will be obvious to those skilled in the art in view of the above disclosure.

I claim:

1. An integrated circuit chip assembly comprising:
   an integrated circuit chip die made of semiconductor material;
   a central active chip area on said die, said active chip area having desired integrated circuit components and contact sites therein;
   interconnect metallization extending from said contact sites in said active chip area to positions on said die exterior of said active chip area;
   an integral band area of a predetermined width in said die and peripherally surrounding said active chip area;
   a series of spaced integrated circuit chip input/output pad areas extending along an outer periphery of said band area and connected to said contact sites by said metallization; and a discrete cap made from the same semiconductor material as said die and spatially covering said active chip area, said cap including a peripheral edge portion sealingly affixed around an inner periphery of said integral band area, such that said active chip area is hermetically sealed by said cap and said input/output pad areas are exposed outside the resultant capped and sealed active chip area.

2. The assembly of claim 1 in which said integral band area is about 12 mils in width.

3. The assembly of claim 1 in which said input/output pad areas comprise wire bond pads.

4. The assembly of claim 1 in which said input/output pad areas include a conductive bump for attachment of a bonding tape thereto.

5. The assembly of claim 1 in which said cap is photomasked and etched to form said peripheral edge portion.

6. The assembly of claim 1 further including a screened glass paste for sealing said cap peripheral edge to said inner periphery of said integral band area.

7. The assembly of claim 1 wherein the semiconductor material of said active chip area, said integral band area, and said cap is silicon.

8. The assembly of claim 1 in which said interconnect metallization extends along a surface of said die from said contact sites to said input/output pad areas.

9. The assembly of claim 1 in which said die, said active chip area and said cap are of a generally rectangular shape.

* * * * *